United States Patent
Brabec et al.

(10) Patent No.: US 8,574,947 B2
(45) Date of Patent: Nov. 5, 2013

(54) METHODS OF PREPARING PHOTOVOLTAIC MODULES

(76) Inventors: Christoph Josef Brabec, Linz (AT); Robert D. Eckert, Lexington, MA (US); Robert L. Graves, Jr., Methuen, MA (US); Jens Hauch, Heroldsberg (DE); Karl Pichler, Admont (AT); Igor Sokolik, East Boston, MA (US); Lian Wang, Lowell, MA (US)

( * ) Notice: Subject to any disclaimer, the term of this patent is extended or adjusted under 35 U.S.C. 154(b) by 0 days.

(21) Appl. No.: 13/082,879

(22) Filed: Apr. 8, 2011

(65) Prior Publication Data

US 2011/0189812 A1    Aug. 4, 2011

Related U.S. Application Data

(63) Continuation of application No. 12/503,721, filed on Jul. 15, 2009, now Pat. No. 7,932,124.

(60) Provisional application No. 61/081,100, filed on Jul. 16, 2008, provisional application No. 61/147,515, filed on Jan. 27, 2009.

(51) Int. Cl.
     *H01L 31/18*      (2006.01)

(52) U.S. Cl.
     USPC ..................................... 438/73; 257/E31.124

(58) Field of Classification Search
     None
     See application file for complete search history.

(56) References Cited

U.S. PATENT DOCUMENTS

| | | | |
|---|---|---|---|
| 5,593,901 A | 1/1997 | Oswald et al. | |
| 6,168,968 B1 | 1/2001 | Umemoto et al. | |
| 7,186,911 B2 | 3/2007 | Ryan | |
| 2005/0253142 A1 | 11/2005 | Negami et al. | |
| 2006/0152833 A1 | 7/2006 | Halls et al. | |
| 2007/0115399 A1* | 5/2007 | Brabec et al. | 349/42 |
| 2010/0015752 A1 | 1/2010 | Brabec et al. | |

FOREIGN PATENT DOCUMENTS

| | | |
|---|---|---|
| WO | WO 2005/119782 | 12/2005 |
| WO | WO 2008/022383 | 2/2008 |

OTHER PUBLICATIONS

Aberle et al., "Recent advances in polycrystalline silicon thin-film solar cells on glass at UNSW", Photovoltaic Specialists Conference, 2005, pp. 877-882, (2005).

Walsh et al., "Novel method for the interconnection of thin-film silicon solar cells on glass", Photovoltaic Specialists Conference, 2005, pp. 1229-1232, (2005).

International Search Report and Written Opinion issued on Jun. 2, 2010 in the corresponding PCT Application No. PCT/US09/050748, filed on Jul. 15, 2009.

* cited by examiner

*Primary Examiner* — Seahvosh Nikmanesh
(74) *Attorney, Agent, or Firm* — Bowditch & Dewey, LLP; Roger P. Zimmerman

(57) ABSTRACT

Methods of preparing photovoltaic modules, as well as related components, systems, and devices, are disclosed.

5 Claims, 7 Drawing Sheets

METHODS OF PREPARING PHOTOVOLTAIC MODULES

CROSS REFERENCE TO RELATED APPLICATIONS

Pursuant to 35 U.S.C. §120, this application is a continuation of and claims priority to U.S. application Ser. No. 12/503,721, filed Jul. 15, 2009, now U.S. Pat. No. 7,932,124, granted Apr. 26, 2011, which in turn claims priority to U.S. Provisional Application Ser. No. 61/081,100, filed Jul. 16, 2008, and U.S. Provisional Application Ser. No. 61/147,515, filed Jan. 27, 2009. The contents of the parent applications are hereby incorporated by reference.

TECHNICAL FIELD

This invention relates to methods of preparing photovoltaic modules, as well as related components, systems, and devices.

BACKGROUND

Photovoltaic cells are commonly used to transfer energy in the form of light into energy in the form of electricity. A typical photovoltaic cell includes a photoactive material disposed between two electrodes. Generally, light passes through one or both of the electrodes to interact with the photoactive material, thereby generating charge carriers (i.e., electrons and holes). As a result, it is desirable for at least one of the electrodes to be at least semi-transparent.

SUMMARY

In one aspect, this disclosure features a method that includes forming a first multilayer device containing a first electrically conductive layer and a photoactive layer on a substrate and, after forming the first multilayer device, treating the first electrically conductive layer to form a plurality of electrodes, thereby converting the first multilayer device into a first photovoltaic cell. The first electrically conductive layer is between the photoactive layer and the substrate.

In another aspect, this disclosure features a method that includes forming a first electrically conductive layer, a photoactive layer, and a hole carrier layer on a substrate, and treating the first electrically conductive layer, the photoactive layer, and the hole carrier layer to form a plurality of discrete multilayer devices, each of which contains a first electrode, a photoactive layer, and a hole carrier layer. The first electrically conductive layer is between the substrate and the photoactive layer and the photoactive layer is between the first electrically conductive layer and the hole carrier layer.

In still another aspect, this disclosure features a method that includes forming a multilayer device containing a first electrically conductive layer and a second layer on a substrate, and after forming the multilayer device, forming the first electrically conductive layer into a plurality of discrete electrodes. The first electrically conductive layer is between the substrate and the second layer.

Embodiments can include one or more of the following features.

The method can further include forming a second multilayer device on the substrate before treating first electrically conductive layer. The second multilayer device can include a first electrically conductive layer and a photoactive layer. The first and second electrically conductive layers of the first and second multilayer devices can be the same layer. Treating the first electrically conductive layer can convert the second multilayer device into a second photovoltaic cell.

Each of the first and second multilayer devices can further include a hole carrier layer and/or a second electrically conductive layer.

Treating the first electrically conductive layer can be carried out by laser ablation or mechanical scribing.

Treating the first electrically conductive layer can form a cavity (i.e., an empty space) in the first electrically conductive layer between the first and second multilayer devices.

The method can further include disposing a first insulator between the first and second photovoltaic cells after treating the first electrically conductive layer. In some embodiments, at least a portion of the first insulator is disposed in the cavity between the first and second multilayer devices. In some embodiments, the method can further include disposing an electrically conductive material over the first insulator, thereby electrically connecting the first and second photovoltaic cells. In certain embodiments, the second electrically conductive layer of the first photovoltaic cell is electrically connected to the first electrically conductive layer of the second photovoltaic cell through the electrically conductive material.

The method can further include disposing a first insulator before treating the first electrically conductive layer. In some embodiments, the first insulator prevents debris formed during treating the first electrically conductive layer from interacting with the first and second photovoltaic cells. In such embodiments, the method can further include disposing a second insulator after treating the first electrically conductive layer. At least a portion of the second insulator can be disposed in the cavity between the first and second multilayer devices. In some embodiments, the method further includes disposing an electrically conductive material over the first and second insulators, thereby electrically connecting the first and second photovoltaic cells. In certain embodiments, the second electrically conductive layer of the first photovoltaic cell is electrically connected to the first electrically conductive layer of the second photovoltaic cell through the electrically conductive material.

Treating the first electrically conductive layer can be carried out on the first electrically conductive layer at a location beneath the first insulator. In such embodiments, treating the first electrically conductive layer can be carried out by irradiation with a laser. For example, the laser can be irradiated from the side of the substrate that is opposite to the side on which the first multilayer device is disposed. In some embodiments, the method can further include disposing an electrically conductive material over the first insulator, thereby electrically connecting the first and second photovoltaic cells. In certain embodiments, the second electrically conductive layer of the first photovoltaic cell is electrically connected to the first electrically conductive layer of the second photovoltaic cell through the electrically conductive material.

The method can further include disposing a first insulator before treating the first electrically conductive layer. In some embodiments, an electrically conductive material is also disposed over the first insulator before treating the first electrically conductive layer. In some embodiments, treating the first electrically conductive layer is carried out on the first electrically conductive layer at a location beneath the first insulator. In some embodiments, treating the first electrically conductive layer is carried out by irradiation with a laser from the side of the substrate that is opposite to the side on which the first multilayer is disposed. In some embodiments, the electrically conductive material forms a second electrically conductive layer of the first photovoltaic cell and is electrically connected to the first electrically conductive layer of the second photovoltaic cell.

Treating the first electrically conductive layer, the photoactive layer, and the hole carrier layer can be carried out by irradiation with a first laser (e.g., having a wavelength absorbed by the first electrically conductive layer, the photoactive layer, and the hole carrier layer). In some embodiments, the method can further include irradiating a second laser (e.g., having a wavelength absorbed by the photoactive layer and hole carrier layer in each multilayer device) to the photoactive layer and hole carrier layer in each multilayer device, thereby forming a cavity in the photoactive layer and hole carrier layer in each device. In some embodiments, the method further includes disposing a first insulator between each two discrete devices of the plurality of multilayer devices. In such embodiments, the method can further include disposing a second electrically conductive layer over the first insulator to form a plurality of photovoltaic cells, the second electrically conductive layer of one photovoltaic cell electrically connecting to the first electrically conductive layer of a neighboring photovoltaic cell. In some embodiments, the method further includes disposing a second insulator into at least a portion of each cavity.

The first multilayer device can further include a second electrically conductive layer supported by the hole carrier layer before treating the first electrically conductive layer, the photoactive layer and the hole carrier layer. In some embodiments, the method can further include treating the second electrically conductive layer to form a plurality of second electrodes, thereby forming a plurality of discrete photovoltaic cells. In such embodiments, treating the first electrically conductive layer, the photoactive layer, the hole carrier layer, and the second electrically conductive layer is carried out by irradiation with a first laser (e.g., having a wavelength absorbed by the first and second electrically conductive layers, the photoactive layer, and the hole carrier layer). In some embodiments, the method can further include disposing a first insulator between the discrete cells of the plurality of photovoltaic cells. In some embodiments, the method can further include irradiating a second laser to the plurality of photovoltaic cells, thereby forming first and second cavities in the photoactive layer, the hole carrier layer, and the second electrode of each photovoltaic cell. In such embodiments, the method can further include disposing a third electrically conductive material in at least a portion of the first cavity of a photovoltaic cell, the third electrically conductive material electrically connecting the first electrode of the photovoltaic cell and the second electrode of a neighboring photovoltaic cell.

The method can further include disposing a second insulator between the first electrically conductive layer and the photoactive layer at a location the first insulator is to be deposited before irradiating the first laser to the first electrically conductive layer, the photoactive layer, the hole carrier layer, and the second electrically conductive layer.

The method can form a plurality of photovoltaic cells.

Each of the photovoltaic cells can include a respective electrode of the plurality of discrete electrodes, which can be formed by laser ablation or mechanical scribing.

The plurality of discrete electrodes can be formed by irradiating a laser to the first electrically conductive layer. In some embodiments, the laser is irradiated to the first electrically conductive layer either from the side of the substrate on which the first electrically conductive layer and the second layer are disposed or its opposite side. In some embodiments, the laser reaches the first electrically conductive layer by passing through the substrate or the second layer (e.g., not substantially absorbed by the substrate or the second layer). In some embodiments, the irradiation forms a plurality of cavities so that each discrete electrode is separated from another discrete electrode by a cavity.

The laser can be a fiber laser.

The laser can have a wavelength ranging from about 200 nm to about 1,600 nm (e.g., about 1,064 nm).

The second layer can be a hole blocking layer, a photoactive layer, a hole carrier layer, or a second electrically conductive layer.

Forming the multilayer device can further include forming a hole blocking layer, a hole carrier layer, and a second electrically conductive layer, in which the hole blocking layer is between the first electrically conductive layer and the photoactive layer, the photoactive layer is between the hole blocking layer and the hole carrier layer, and the hole carrier layer is between the photoactive layer and the second electrically conductive layer.

Forming the multilayer device can further include forming a hole carrier layer, a hole blocking layer, and a second electrically conductive layer, in which the hole carrier layer is between the first electrically conductive layer and the photoactive layer, the photoactive layer is between the hole carrier layer and the hole blocking layer, and the hole blocking layer is between the photoactive layer and the second electrically conductive layer.

Embodiments can provide one or more of the following advantages.

Without wising to be bound by theory, it is believed that patterning the first electrically conductive layer to form bottom electrodes after photoactive layers of the photovoltaic cells are formed on top of the bottom electrodes could minimize short circuit between two neighboring photovoltaic cells.

Without wishing to be bound by theory, it is believed that disposing an insulator into at least a portion of a cavity between two neighboring photovoltaic cells can minimize short circuit of the bottom electrodes of these two cells. Further, without wishing to be bound by theory, it is believed that disposing an insulator between two photovoltaic cells can effectively minimize short circuit of these two cells resulted from the debris formed during the treatment of an electrically conductive layer.

Without wishing to be bound by theory, it is believed that disposing an additional insulator before treating an electrically conductive layer can more effectively protect the photovoltaic cells formed in a final module from short circuit resulted from any debris generated during the treatment process.

In some embodiments, two discrete photovoltaic cells can be formed by treating (e.g., by laser ablation or mechanical scribing) an electrically conductive material in an electrically conductive layer at a location beneath an insulator between the two cells into an electrically non-conductive material or a cavity. Without wishing to be bound by theory, it is believed that an advantage of this approach is that short circuit between the two photovoltaic cells can be minimized because essentially no debris is formed during the treatment process.

Other features and advantages of the invention will be apparent from the description, drawings, and claims.

DESCRIPTION OF DRAWINGS

FIG. 1(b) is a second step in the first embodiment of forming a photovoltaic module.

FIG. 1(c) is a third step in the first embodiment of forming a photovoltaic module.

Like reference symbols in the various drawings indicate like elements.

DETAILED DESCRIPTION

This disclosure relates to methods of preparing photovoltaic modules, as well as related components, systems, and devices. In some embodiments, photovoltaic modules can be prepared by a general method of (1) forming at least a first multilayer device on a substrate, the first multilayer device containing at least a first electrically conductive layer and a photoactive layer; and (2) after forming the first multilayer device, treating the first electrically conductive layer to form a plurality of electrodes, thereby converting the first multilayer device into a first photovoltaic cell or a plurality of photovoltaic cells including a first photovoltaic cell.

In some embodiments, the general method can include first forming a plurality of multilayer devices including a first multilayer device on a substrate. The first multilayer device can include a first electrically conductive layer (which later forms a bottom electrode), a photoactive layer, a hole carrier layer and a top electrode sequentially disposed on the substrate. The first electrically conductive layer can then be treated (e.g., by laser ablation or mechanical scribing) to form a bottom electrode, thereby converting the first multilayer device into a first photovoltaic cell.

In some embodiments, the general method can include forming a first multilayer device containing a first electrically conductive layer, a photoactive layer, and a hole carrier layer sequentially disposed on a substrate. The first multilayer device can then be treated (e.g., by laser ablation or mechanical scribing) to form a plurality of discrete multilayer devices, each of which includes a bottom electrode, a photoactive layer, and a hole carrier layer. These discrete multilayer devices can then be configured (e.g., after forming top electrodes) to form discrete photovoltaic cells. The first multilayer device can also include a second electrically conductive layer disposed on the hole carrier layer so that discrete photovoltaic cells can be formed upon treating the first multilayer device (e.g., by laser ablation).

Figure 1:
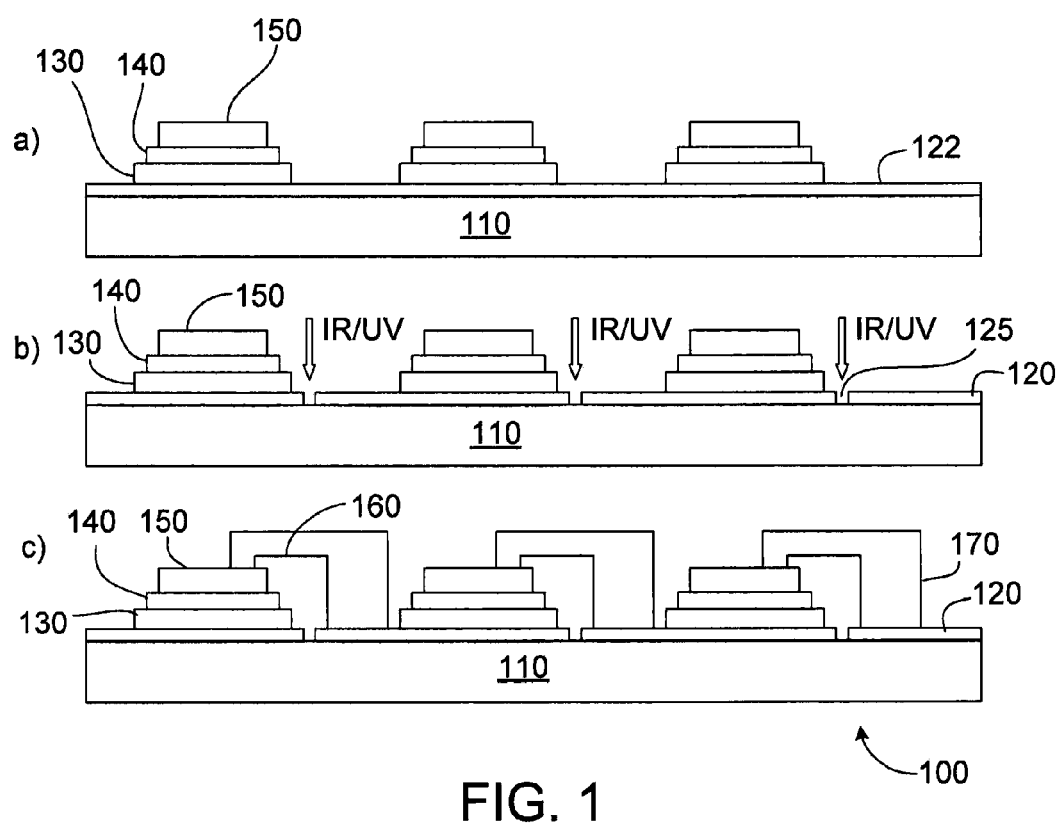
FIG. 1($a$) is a first step in a first embodiment of forming a photovoltaic module.

FIG. 1 shows a first embodiment of the general method described above. This embodiment forms a photovoltaic module 100 that contains a plurality of photovoltaic cells (e.g., organic photovoltaic cells). Each photovoltaic cell in photovoltaic module 100 contains a substrate 110, a bottom electrode 120, a photoactive layer 130 (e.g., containing an electron donor material and an electron acceptor material), a hole carrier layer 140, and a top electrode 150. An insulator 160 is disposed between two neighboring photovoltaic cells. The top electrode of one photovoltaic cell is electrically connected to the bottom electrode of a neighboring photovoltaic cell via an interconnecting electrically conductive material 170.

Photovoltaic module 100 shown in FIG. 1 can be prepared by three main steps as follows:

First, as shown in FIG. 1(a), after a first electrically conductive layer 122 (which later forms bottom electrodes 120) is disposed on substrate 110, a plurality of photoactive layers 130, hole carrier layers 140, and top electrodes 150 are sequentially disposed on the first electrically conductive layer to form a plurality of multilayer devices. The distance between two neighboring multilayer devices thus formed (e.g., the distance between the two photoactive layers of two neighboring multilayer devices) can be at least about 100 µm (e.g., at least about 200 µm, at least about 500 µm, or at least about 1,000 µm) or at most about 5 mm (e.g., at most about 3 mm, at most about 1 mm, or at most about 0.5 mm).

Second, as shown in FIG. 1(b), first electrically conductive layer 122 can be treated to form a plurality of bottom electrodes 120, thereby forming a plurality of discrete photovoltaic cells that are electrically isolated from each other. This step is also known as patterning first electrically conductive layer 122. For example, first electrically conductive layer 122 can be treated to form a cavity 125 (i.e., an empty space) between every two neighboring multilayer devices. Typically, cavity 125 completely separates two neighboring multilayer devices to form two discrete photovoltaic cells (e.g., without any short circuiting between two neighboring cells). In some embodiments, cavity 125 can have a length of at least about 1 µm (e.g., at least about 10 µm, at least about 50 µm, or at least about 100 µm) or at most about 500 µm (e.g., at most about 300 µm, at most about 100 µm, or at most about 50 µm). In some embodiments, the depth of cavity 125 is similar to or slightly larger than the thickness of first electrically conductive layer 122.

Generally, first electrically conductive layer 122 can be treated by any suitable methods. Examples of such treating methods include laser ablation and mechanical scribing, both of which are known in the art. In some embodiments, when laser ablation is used to treat first electrically conductive layer 122, the laser can have a wavelength absorbed by the material used to make first electrically conductive layer 122. In some embodiments, the laser can have a wavelength in the infrared region (e.g., ranging from about 750 nm to about 1,600 nm), in the visible light region (e.g., ranging from about 400 nm to about 750 nm), or in the ultraviolet region (e.g., ranging from about 200 nm to about 400 nm). For example, when first electrically conductive layer 122 includes indium tin oxide, the laser used to treat this layer can have a wavelength of 1,064 nm. In some embodiments, the laser is a fiber laser.

Without wising to be bound by theory, it is believed that patterning first electrically conductive layer 122 to form bottom electrodes after photoactive layers of the photovoltaic cells are formed on top of layer 122 could minimize short circuit between two neighboring photovoltaic cells.

Finally, as shown in FIG. 1(c), insulators 160 can be disposed between every two neighboring discrete photovoltaic cells to electrically insulate each cell from other cells. In some embodiments, at least a portion of insulator 160 can be disposed in at least a portion of cavity 125 (e.g., the entire cavity) between two neighboring photovoltaic cells. Without wishing to be bound by theory, it is believed that disposing insulator 160 into at least a portion of cavity 125 can minimize short circuit of the bottom electrodes of two neighboring photovoltaic cells. Further, without wishing to be bound by theory, it is believed that disposing insulator 160 between two photovoltaic cells can effectively minimize short circuit of these two cells resulted from the debris generated during the treatment of first electrically conductive layer 122.

In general, insulator 160 can be made of any suitable insulating materials, such as polymers prepared from monomeric materials such as amines, acrylates, epoxies, urethanes, or combinations thereof. Examples of suitable amines include di, tri, or multifunctional amines, such as Jeffamines or polyethyleneimines. Examples of suitable epoxies include mono, di, tri, or multifunctional epoxies, such as glycidol, biphenol diepoxides, or 1,3-propane diglycidyl epoxide. These monomeric materials can be either coated on a substrate from a solvent or coated on a substrate directly without using a solvent when they are in the form of a liquid at room temperature. In some embodiments, the monomeric materials (e.g., amines and epoxides) can be mixed, coated on a substrate, and thermally treated to produce transparent or translucent polymers as an insulator. Alternatively, a photoinitiator can be added to a mixture of epoxides (with or without a solvent). After the mixture was coated on a substrate and dried, it can be irradiated (e.g., with a UV light) to produce a tough flexible network of polymers.

After insulators 160 are disposed, interconnecting electrically conductive material 170 can then be deposited over insulator 160 between two neighboring photovoltaic cells, thereby electrically connecting the top electrode of a photovoltaic cell with the bottom electrode of a neighboring photovoltaic cell. Photovoltaic module 100 thus formed include a plurality of photovoltaic cells that are electrically connected in series.

Substrate 110 is generally formed of a transparent material. As used herein, a transparent material refers to a material that, at the thickness used in a photovoltaic cell, transmits at least about 70% (e.g., at least about 75%, at least about 80%, at least about 85%, or at least about 90%) of incident light at a wavelength or a range of wavelengths (e.g., from about 350 nm to about 1,000 nm) used during operation. Exemplary materials from which substrate 110 can be formed include polyethylene terephthalates, polyimides, polyethylene naphthalates, polymeric hydrocarbons, cellulosic polymers, polycarbonates, polyamides, polyethers and polyether ketones. In certain embodiments, the polymer can be a fluorinated polymer. In some embodiments, combinations of polymeric materials are used. In certain embodiments, different regions of substrate 110 can be formed of different materials. Examples of suitable substrates are described in commonly-owned co-pending U.S. Patent Application Publication Nos. 2004-0187911 and 2006-0090791, the entire contents of which are hereby incorporated by reference.

In some embodiments, bottom electrode 120, top electrode 150, and electrically conductive material 170 can be formed of any suitable electrically conductive material. Examples of suitable electrically conductive materials include electrically conductive metals, electrically conductive alloys, electrically conductive polymers, and electrically conductive metal oxides. Exemplary electrically conductive metals include gold, silver, copper, aluminum, nickel, palladium, platinum, and titanium. Exemplary electrically conductive alloys include stainless steel (e.g., 332 stainless steel, 316 stainless steel), alloys of gold, alloys of silver, alloys of copper, alloys of aluminum, alloys of nickel, alloys of palladium, alloys of platinum and alloys of titanium. Exemplary electrically conducting polymers include polythiophenes (e.g., doped poly (3,4-ethylenedioxythiophene) (doped PEDOT)), polyanilines (e.g., doped polyanilines), polypyrroles (e.g., doped polypyrroles). Exemplary electrically conducting metal oxides include indium tin oxide (ITO), fluorinated tin oxide, tin oxide and zinc oxide. In some embodiments, the conductive metal oxides described above can be doped. In some embodiments, bottom electrode 120, top electrode 150, and electrically conductive material 170 can include a multilayer material, such as an ITO/metal/ITO material or a dielectric/metal/dielectric material. In some embodiments, a combination of the materials described above can be used.

In some embodiments, bottom electrode 120 and top electrode 150 can include a mesh electrode. Examples of mesh electrodes are described in commonly-owned co-pending U.S. Patent Application Publication Nos. 2004-0187911 and 2006-0090791, the entire contents of which are hereby incorporated by reference.

In some embodiments, photoactive layer 130 can include an organic electron donor material or an organic electron acceptor material. Suitable organic electron donor materials include conjugated polymers, such as polythiophenes (e.g., poly(3-hexylthiophene) (P3HT)) or poly(phenylene-vinylene)s (PPVs). Suitable organic electron acceptor materials include fullerenes (e.g., a substituted fullerene such as [6,6]-phenyl C61-butyric acid methyl ester (C61-PCBM) and [6,6]-phenyl C71-butyric acid methyl ester (C71-PCBM)). Examples of suitable organic electron donor or acceptor materials are described in, for example, commonly-owned co-pending U.S. Patent Application Publication Nos. 2007-0020526, 2008-0087324, and 2008-0121281, the entire contents of which are hereby incorporated by reference.

In some embodiments, hole carrier layer 140 can include a semiconductive polymer. Exemplary polymers include polythiophenes, polyfluorenes, polyphenylene vinylenes, polyanilines, and polyacetylenes. In some embodiments, the polymer is formed from thieno[3,4-b]thiophene monomer units. Examples of commercially available semiconductive polymers include H.C. Starck BAYTRON® family of polymers (e.g., PEDOT) and the Air Products® HIL family of polymers. In some embodiments, hole carrier layer 140 can include a dopant used in combination with a semiconductive polymer. Examples of dopants include poly(styrene-sulfonate)s, polymeric sulfonic acids, or fluorinated polymers (e.g., fluorinated ion exchange polymers). Other examples of suitable hole carrier materials are described in, for example, commonly-owned co-pending U.S. Provisional Application Publication No. 60/985,006, the entire contents of which are hereby incorporated by reference.

In general, the methods of preparing each layer (e.g., first electrically conductive layer 122, photoactive layer 130, hole carrier layer 140, top electrode 150, insulator 160, and the interconnecting electrically conductive material 170) in the photovoltaic cells described in FIG. 1 can vary as desired. In some embodiments, a layer can be prepared by a liquid-based coating process. In certain embodiments, a layer can be prepared via a gas phase-based coating process, such as chemical or physical vapor deposition processes.

The term "liquid-based coating process" mentioned herein refers to a process that uses a liquid-based coating composition. Examples of the liquid-based coating composition include solutions, dispersions, or suspensions. The liquid-based coating process can be carried out by using at least one of the following processes: solution coating, ink jet printing, spin coating, dip coating, knife coating, bar coating, spray coating, roller coating, slot coating, gravure coating, flexographic printing, and screen printing. Examples of liquid-based coating processes have been described in, for example, commonly-owned co-pending U.S. Application Publication No. 2008-0006324, the entire contents of which are hereby incorporated by reference.

Figure 2:
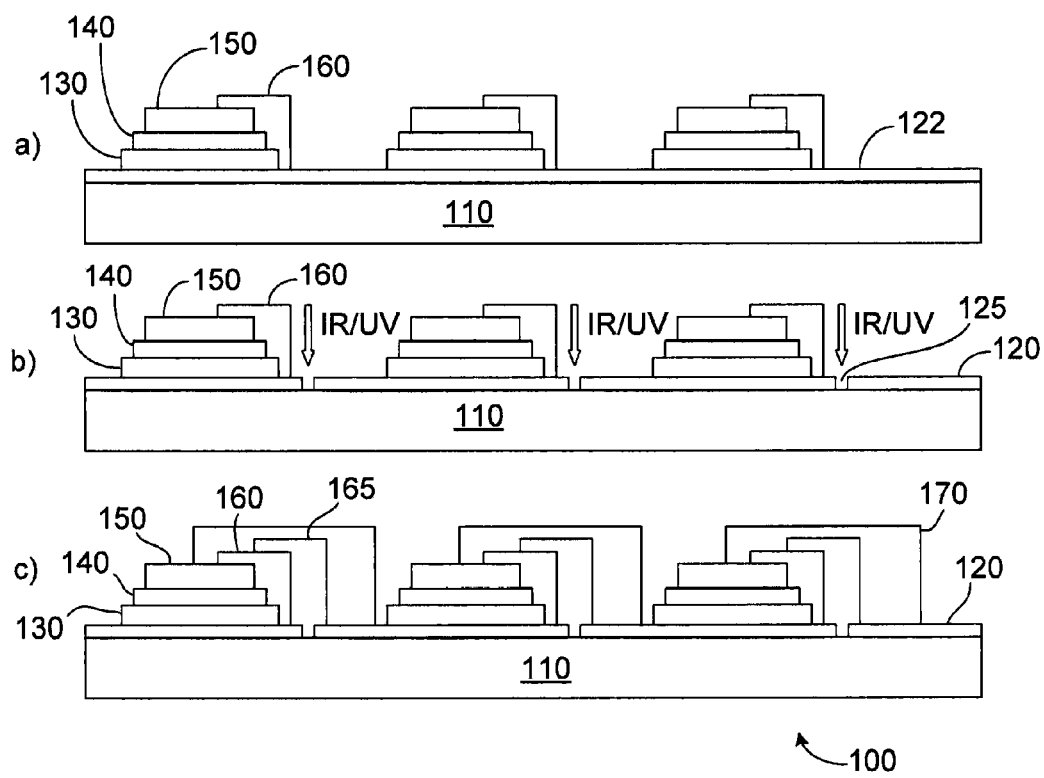
FIG. 2(a) is a first step in a second embodiment of forming a photovoltaic module.
FIG. 2(b) is a second step in the second embodiment of forming a photovoltaic module.
FIG. 2(c) is a third step in the second embodiment of forming a photovoltaic module.

FIG. 2 shows a second embodiment of the general method described above. Similar to the photovoltaic module shown in FIG. 1, photovoltaic module 100 formed in this embodiment contains a plurality of photovoltaic cells, each of which includes a substrate 110, a bottom electrode 120, a photoactive layer 130, a hole carrier layer 140, and a top electrode 150. An insulator 160 and an insulator 165 are disposed between two neighboring photovoltaic cells. The top electrode of one photovoltaic cell is electrically connected to the bottom electrode of a neighboring photovoltaic cell via an interconnecting electrically conductive material 170.

Photovoltaic module 100 shown in FIG. 2 can be prepared by three main steps as follows:

First, as shown in FIG. 2(*a*), after a first electrically conductive layer 122 (which later forms bottom electrodes 120) is disposed on substrate 110, a plurality of photoactive layers 130, hole carrier layers 140, and top electrodes 150 are sequentially disposed on first electrically conductive layer 122 to form a plurality of multilayer devices. Unlike the method shown in FIG. 1, a plurality of additional insulators 160 are disposed between every two neighboring multilayer devices before first electrically conductive layer 122 is treated to form a plurality of bottom electrodes. Without wishing to be bound by theory, it is believed that disposing additional insulators before treating first electrically conductive layer 122 can prevents debris generated during treating first electrically conductive layer 122 from interacting with the photovoltaic cells in the final module 100, thereby more effectively protecting the photovoltaic cells from short circuit resulted from such debris.

Second, as shown in FIG. 2(*b*), first electrically conductive layer 122 can be treated (e.g., by irradiation of a laser from the top of layer 122) to form a plurality of bottom electrodes 120, thereby forming a plurality of discrete photovoltaic cells that are electrically isolated from each other. For example, first electrically conductive layer 122 can be treated to form a cavity 125 between every two neighboring multilayer devices. Typically, cavity 125 would completely separate two neighboring multilayer devices to form two discrete photovoltaic cells (e.g., without any short circuiting between two neighboring cells). Without wishing to be bound by theory, it is believed that, when cavity 125 is generated by laser ablation, the material evaporated by the laser ablation (i.e., the debris) can be deposited on substrate 110.

Finally, as shown in FIG. 2(*c*), insulators 165 can be disposed between every two neighboring discrete photovoltaic cells to electrically insulate each cell from other cells. In some embodiments, at least a portion of insulator 165 can be disposed in at least a portion of the cavity (e.g., the entire cavity) between two neighboring photovoltaic cells to avoid short circuit of two neighboring bottom electrodes (e.g., caused by the debris generated during laser ablation). After insulators 165 are disposed, interconnecting electrically conductive material 170 can be deposited over insulators 160 and 165 between two neighboring photovoltaic cells, thereby electrically connecting the top electrode of a photovoltaic cell with the bottom electrode of a neighboring photovoltaic cell. Photovoltaic module 100 thus formed include a plurality of photovoltaic cells that are electrically connected in series.

Other characteristics or aspects of the method and photovoltaic module described in FIG. 2 can be the same as those described in FIG. 1.

Figure 3:
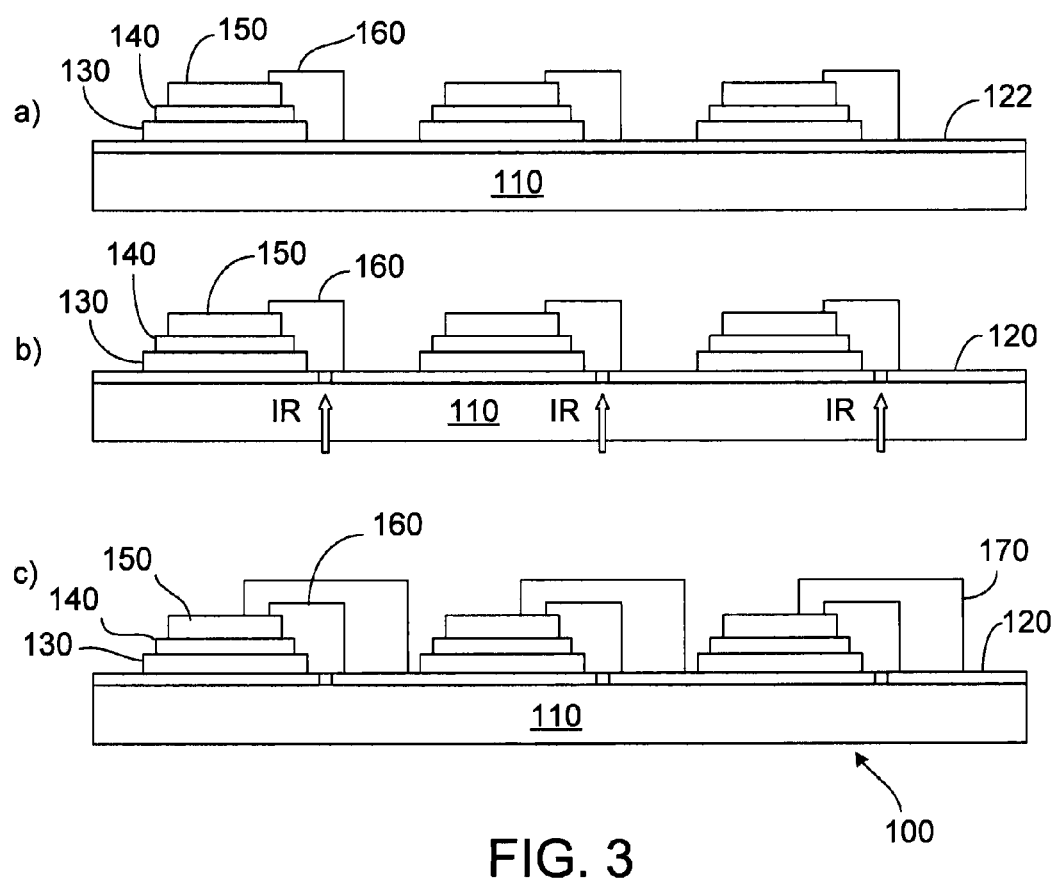
FIG. 3(a) is a first step in a third embodiment of forming a photovoltaic module.
FIG. 3(b) is a second step in the third embodiment of forming a photovoltaic module.
FIG. 3(c) is a third step in the third embodiment of forming a photovoltaic module.

FIG. 3 shows a third embodiment of the general method described above. Similar to the photovoltaic module shown in FIG. 1, photovoltaic module 100 formed in this embodiment contains a plurality of photovoltaic cells, each of which includes a substrate 110, a bottom electrode 120, a photoactive layer 130, a hole carrier layer 140, and a top electrode 150. An insulator 160 is disposed between two neighboring photovoltaic cells. The top electrode of one photovoltaic cell is electrically connected to the bottom electrode of a neighboring photovoltaic cell via an interconnecting electrically conductive material 170.

Photovoltaic module 100 shown in FIG. 3 can be prepared by three main steps as follows:

First, as shown in FIG. 3(*a*), after a first electrically conductive layer 122 (which later forms bottom electrodes 120) is disposed on substrate 110, a plurality of photoactive layers 130, hole carrier layers 140, and top electrodes 150 are sequentially disposed on first electrically conductive layer 122 to form a plurality of multilayer devices. Unlike the method shown in FIG. 1, a plurality of insulators 160 are disposed between every two neighboring multilayer devices before first electrically conductive layer 122 is treated to form a plurality of bottom electrodes.

Second, as shown in FIG. 3(*b*), first electrically conductive layer 122 can be treated (e.g., by using laser ablation) at locations beneath insulators 160 to form a plurality of bottom electrodes 120, thereby forming a plurality of discrete photovoltaic cells that are electrically isolated from each other. In such an embodiment, the treatment can be carried out by irradiating the bottom of first electrically conductive layer 122 with a laser at a suitable location beneath insulator 160 of a multilayer device. Without wishing to be bound by theory, it is believed that the laser can burn up the electrically conductive material at that location and create an ablation cavity, thereby forming electrically separated bottom electrodes 120, and that the material evaporated by the laser ablation (i.e., the debris) can be deposited into insulator 160. In such embodiments, the laser can have a wavelength (e.g., about 1,064 nm) primarily absorbed by first electrically conductive layer 122, but not substantially absorbed by the other layers (such as substrate 110). In some embodiments, first electrically conductive layer 122 can be irradiated with a laser from the top of layer 122. In such embodiments, the laser can have a wavelength (e.g., about 1,064 nm) primarily absorbed by first electrically conductive layer 122, but not substantially absorbed by insulator 160. Without wishing to be bound by theory, it is believed that an advantage of treating layer 122 at a location beneath insulator 160 is that short circuit between two photovoltaic cells can be minimized because essentially no debris is formed outside the insulating area during the treatment process.

Finally, as shown in FIG. 3(c), interconnecting electrically conductive material 170 can be deposited over insulator 160 between two neighboring photovoltaic cells, thereby electrically connecting the top electrode of a photovoltaic cell with the bottom electrode of a neighboring photovoltaic cell. Photovoltaic module 100 thus formed include a plurality of photovoltaic cells that are electrically connected in series.

Other characteristics or aspects of the method and photovoltaic module described in FIG. 3 can be the same as those described in FIG. 1.

Figure 4:
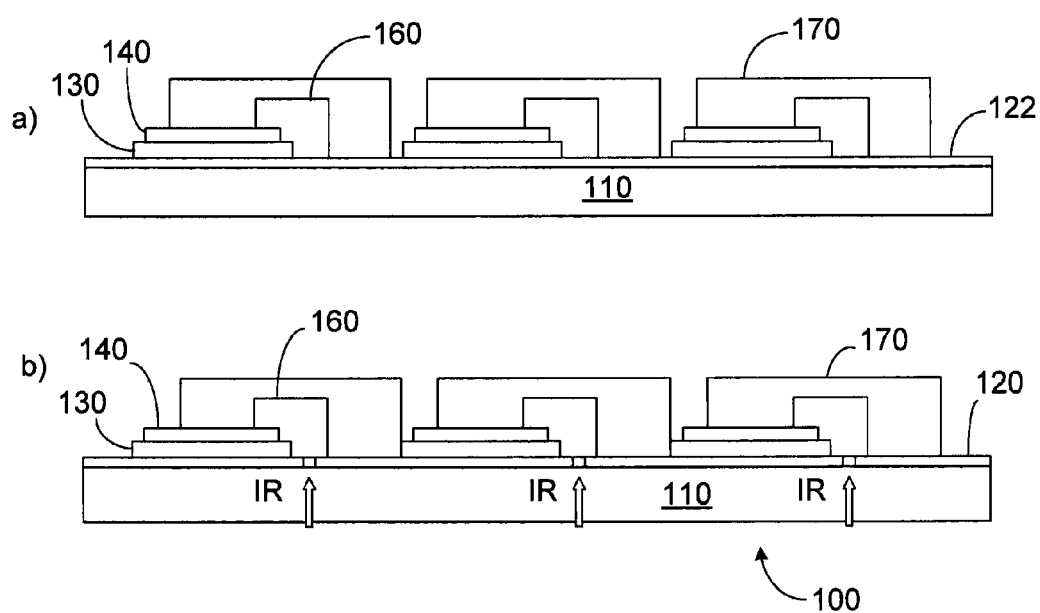
FIG. 4(a) is a first step in a fourth embodiment of forming a photovoltaic module.
FIG. 4(b) is a second step in a fourth embodiment of forming a photovoltaic module.

FIG. 4 shows a fourth embodiment of the general method described above. Photovoltaic module 100 formed in this embodiment contains a plurality of photovoltaic cells, each of which includes a substrate 110, a bottom electrode 120, a photoactive layer 130, and a hole carrier layer 140. An insulator 160 is disposed between two neighboring photovoltaic cells. The hole carrier layer of one photovoltaic cell is electrically connected to the bottom electrode of a neighboring photovoltaic cell via an interconnecting electrically conductive material 170, which also serves as a top electrode of the first photovoltaic cell.

Photovoltaic module 100 shown in FIG. 4 can be prepared by two main steps as follows:

First, as shown in FIG. 4(a), after a first electrically conductive layer 122 (which later forms bottom electrodes 120) is disposed on substrate 110, a plurality of photoactive layers 130, hole carrier layers 140, insulators 160, and interconnecting electrically conductive materials 170 are sequentially disposed on the first electrically conductive layer to form a plurality of multilayer devices. Unlike the method shown in FIG. 1, insulators 160 and interconnecting electrically conductive materials 170 are disposed between every two neighboring multilayer devices before first electrically conductive layer 122 is treated to form a plurality of bottom electrodes.

Second, as shown in FIG. 4(b), first electrically conductive layer 122 can be treated (e.g., by using laser ablation) at locations beneath insulators 160 to form a plurality of bottom electrodes 120, thereby forming a plurality of discrete photovoltaic cells that are electrically isolated from each other. The treatment can be carried out in a manner similar to that described in FIG. 3. Photovoltaic module 100 thus formed includes a plurality of photovoltaic cells that are electrically connected in series.

Other characteristics or aspects of the method and photovoltaic module described in FIG. 4 can be the same as those described in FIG. 1.

Figure 5:
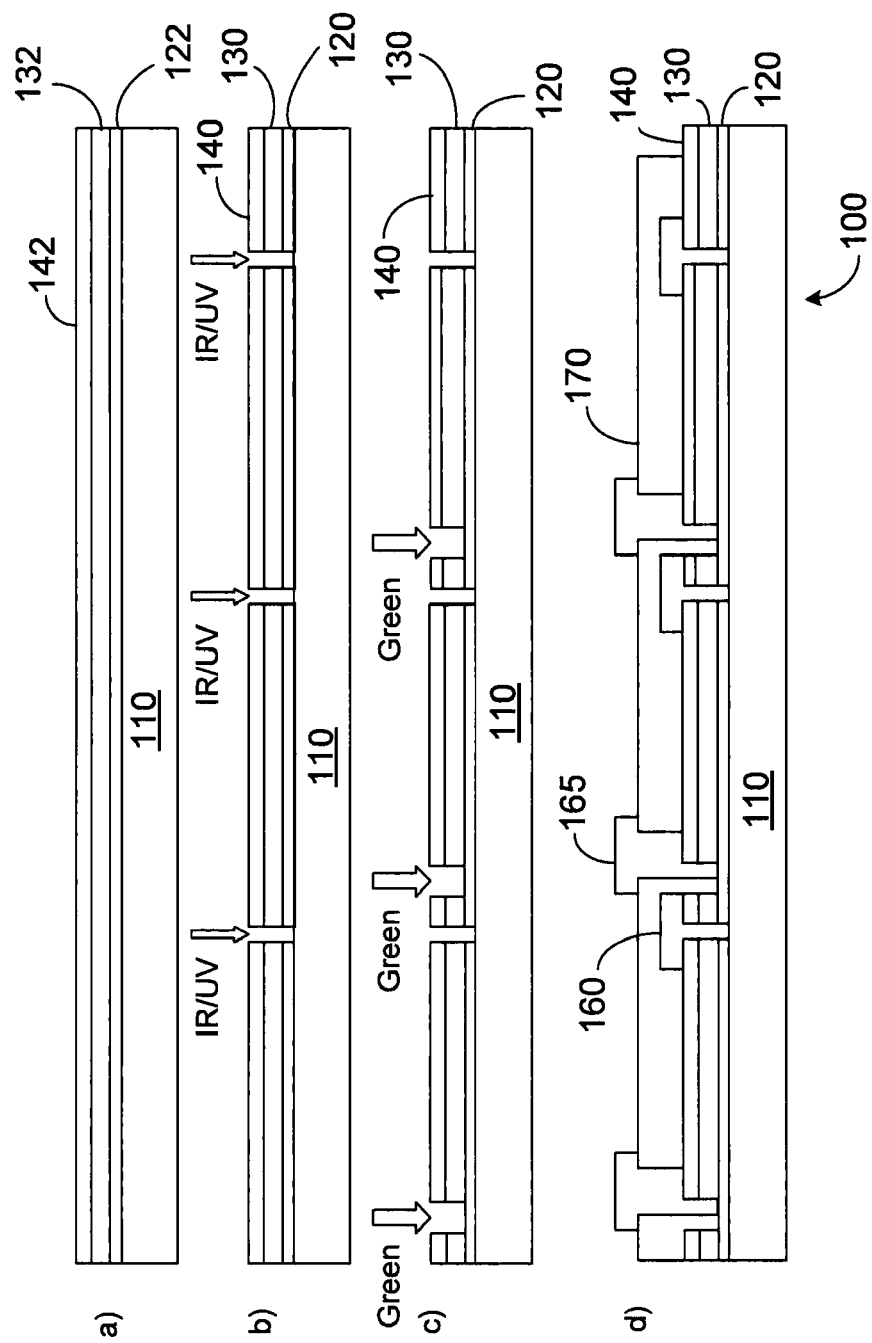
FIG. 5(a) is a first step in a fifth embodiment of forming a photovoltaic module.
FIG. 5(b) is a second step in the fifth embodiment of forming a photovoltaic module.
FIG. 5(c) is a third step in the fifth embodiment of forming a photovoltaic module.
FIG. 5(d) is a fourth step in the fifth embodiment of forming a photovoltaic module.

FIG. 5 shows a fifth embodiment of the general method described above. Photovoltaic module 100 formed in this embodiment contains a plurality of photovoltaic cells, each of which includes a substrate 110, a bottom electrode 120, a photoactive layer 130, and a hole carrier layer 140. An insulator 160 and an optional insulator 165 are disposed between two neighboring photovoltaic cells. The hole carrier layer of one photovoltaic cell is electrically connected to the bottom electrode of a neighboring photovoltaic cell via an interconnecting electrically conductive material 170, which also serves as a top electrode of the first photovoltaic cell.

Photovoltaic module 100 shown in FIG. 5 can be prepared by four main steps as follows:

First, as shown in FIG. 5(a), a first electrically conductive layer 122, a layer of a photoactive material (i.e., layer 132), and a layer of a hole carrier material (i.e., layer 142) are sequentially disposed (e.g., by using a liquid-based coating process) on substrate 110 to form an intermediate article (also referred to herein as "a first multilayer device.").

Second, as shown in FIG. 5(b), the intermediate article can then be treated by a first laser ablation to form a plurality of multilayer devices, in which first electrically conductive layer 122 forms a plurality of bottom electrodes 120, layer 132 forms a plurality of photoactive layers 130, and layer 142 forms a plurality of hole carrier layers 140. For example, the intermediate article can be treated to form a plurality of first cavities in first electrically conductive layer 122, layer 132, and layer 142. The first laser ablation can be carried out by irradiating the intermediate article with a first laser. In some embodiments, the first laser can have a wavelength that is primarily absorbed by first electrically conductive layer 122, layer 132, and layer 142, but substantially not absorbed by substrate 110. For example, the first laser can have a wavelength in the infrared region (e.g., about 1064 nm) or ultraviolet region (e.g., about 355 nm).

Third, as shown in FIG. 5(c), the multilayer devices formed in the second step above can then be treated by a second laser ablation to form a plurality of second cavities in photoactive layers 130 and hole carrier layers 140. In some embodiments, the second laser can have a wavelength that is primarily absorbed by photoactive layer 130 and hole carrier layer 140, but substantially not absorbed by substrate 110 and bottom electrode 120. For example, the second laser can have a wavelength in the visible light (e.g., green light) region, such as about 532 nm. At least a portion of a second cavity can later be filled with an interconnecting electrically conductive material 170 for electrically connecting two neighboring photovoltaic cells.

Finally, as shown in FIG. 5(d), a first insulator 160 can be disposed into a first cavity to electrically separate two neighboring multilayer devices. Interconnecting electrically conductive material 170 can then be disposed over insulator 160 and into at least a portion of a second cavity to form a top electrode of a photovoltaic cell and to electrically connect the top electrode of the photovoltaic cell with the bottom electrode of a neighboring photovoltaic cell. Optionally, a second insulator 165 can be disposed in the second cavity to ensure electrically insulation and to minimize short circuit between two neighboring cells. Photovoltaic module 100 thus formed includes a plurality of photovoltaic cells that are electrically connected in series.

Other characteristics or aspects of the method and photovoltaic module described in FIG. 5 can be the same as those described in FIG. 1.

Figure 6:
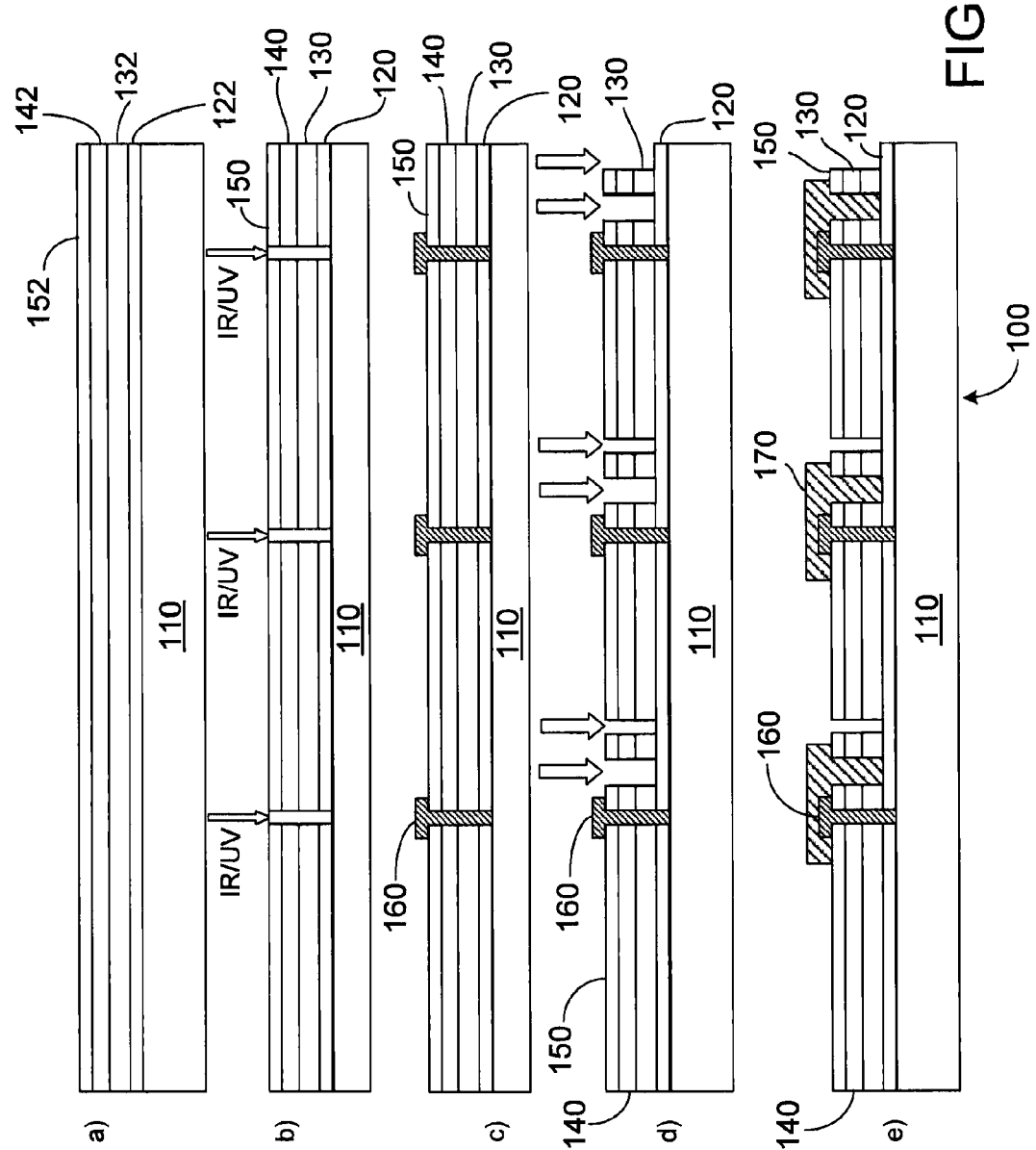
FIG. 6(a) is a first step in a sixth embodiment of forming a photovoltaic module.
FIG. 6(b) is a second step in the sixth embodiment of forming a photovoltaic module.
FIG. 6(c) is a third step in the sixth embodiment of forming a photovoltaic module.
FIG. 6(d) is a fourth step in the sixth embodiment of forming a photovoltaic module.
FIG. 6(e) is a fifth step in the sixth embodiment of forming a photovoltaic module.

FIG. 6 shows a sixth embodiment of the general method described above. Photovoltaic module 100 formed in this embodiment contains a plurality of photovoltaic cells, each of which includes a substrate 110, a bottom electrode 120, a photoactive layer 130, a hole carrier layer 140, and a top electrode 150. An insulator 160 is disposed between two neighboring photovoltaic cells. The top electrode of one photovoltaic cell is electrically connected to the bottom electrode of a neighboring photovoltaic cell via an interconnecting electrically conductive material 170.

Photovoltaic module 100 shown in FIG. 6 can be prepared by five main steps as follows:

First, as shown in FIG. 6(a), a first electrically conductive layer 122, a layer of a photoactive material (i.e., layer 132), a layer of a hole carrier material (i.e., layer 142), and a second electrically conductive layer 152 are sequentially disposed (e.g., by using a liquid-based coating process) on substrate 110 to form an intermediate article.

Second, as shown in FIG. 6(b), the intermediate article can then be treated by a first laser ablation to form a plurality of discrete photovoltaic cells, in which first electrically conductive layer 122 forms a plurality of bottom electrodes 120, layer 132 forms a plurality of photoactive layers 130, layer 142 forms a plurality of hole carrier layers 140, and second electrically conductive layer 152 forms a plurality of top electrodes 150. For example, the intermediate article can be treated to form a plurality of first cavities in first electrically conductive layer 122, layer 132, layer 142, and second electrically conductive layer 152. The first laser ablation can be carried out by irradiating the intermediate article with a first laser. In some embodiments, the first laser can have a wavelength that is primarily absorbed by first electrically conductive layer 122, layer 132, layer 142, and second electrically conductive layer 152, but substantially not absorbed by substrate 110. For example, the first laser can have a wavelength in the infrared (e.g., about 1,064 nm) or ultra-violet region (e.g., about 355 nm).

Third, as shown in FIG. 6(c), a plurality of first insulators 160 can be disposed in the first cavities formed in the second step above to electrically insulate the photovoltaic cells.

Fourth, as shown in FIG. 6(d), the photovoltaic cells formed in the third step above can then be treated by a second laser ablation to form second and third cavities in each photoactive layer 130, each hole carrier layer 140, and each top electrode 150. In some embodiments, the second laser can have a wavelength that is primarily absorbed by photoactive layer 130, hole carrier layer 140, and top electrode 150, but substantially not absorbed by substrate 110 and bottom electrode 120. For example, the second laser can have a wavelength in the visible light region, such as about 532 nm.

Finally, as shown in FIG. 6(e), interconnecting electrically conductive material 170 can then be disposed over each insulator 160 and into at least a portion of each second cavity to electrically connect the top electrode of one photovoltaic cell with the bottom electrode of a neighboring photovoltaic cell. Optionally, a second insulator (not shown in FIG. 6) can be disposed in each third cavity to ensure electrically insulation and to minimize short circuit between two neighboring cells. Photovoltaic module 100 thus formed include a plurality of photovoltaic cells that are electrically connected in series.

Other characteristics or aspects of the method and photovoltaic module described in FIG. 6 can be the same as those described in FIG. 1.

Figure 7:
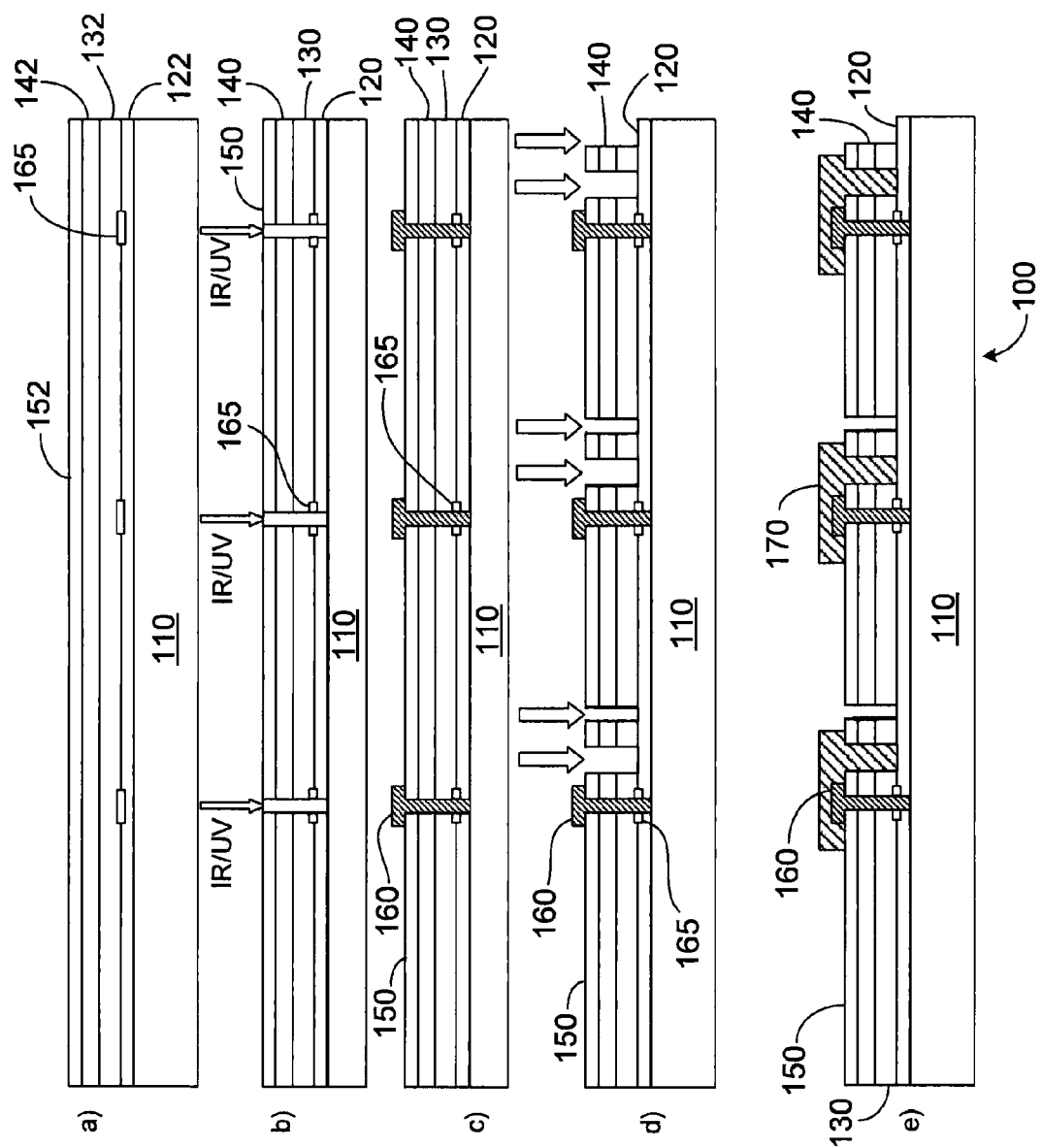
FIG. 7(a) is a first step in a seventh embodiment of forming a photovoltaic module.
FIG. 7(b) is a second step in the seventh embodiment of forming a photovoltaic module.
FIG. 7(c) is a third step in the seventh embodiment of forming a photovoltaic module.
FIG. 7(d) is a fourth step in the seventh embodiment of forming a photovoltaic module.
FIG. 7(e) is a fifth step in the seventh embodiment of forming a photovoltaic module.

FIG. 7 shows a seventh embodiment of the general method described above. Similar to the photovoltaic module shown in FIG. 6, photovoltaic module 100 formed in this embodiment contains a plurality of photovoltaic cells, each of which includes a substrate 110, a bottom electrode 120, a photoactive layer 130, a hole carrier layer 140, and a top electrode 150. Insulator 160 is disposed between two neighboring photovoltaic cells. Unlike the module shown in FIG. 6, an additional insulator 165 is disposed between bottom electrode 120 and photoactive layer 130 at the location insulator 160 is deposited. The top electrode of one photovoltaic cell is electrically connected to the bottom electrode of a neighboring photovoltaic cell via an interconnecting electrically conductive material 170.

As shown in FIGS. 7(a) to 7(e), photovoltaic module 100 can be prepared in a manner similar to that shown in FIG. 6 above except that an additional insulator 165 is disposed during the first step between first electrically conductive layer 122 and layer 132 at a location insulator 160 is to be deposited. Without wishing to be bound by theory, it is believed that insulator 165 can further minimize short circuit between two photoactive layers resulted from any debris generated during treatment the first electrically conductive layer (e.g., by laser ablation). Photovoltaic module 100 thus formed includes a plurality of photovoltaic cells that are electrically connected in series.

While certain embodiments have been disclosed, other embodiments are also possible.

In some embodiments, an electrically conductive layer can be irradiated with a laser from the side of the substrate on which a multilayer device is disposed. For example, electrically conductive layer 122 shown in FIG. 3(a) can be irradiated with a laser from the top of substrate 110. In such embodiments, the laser can have a wavelength such that it is primarily absorbed by layer 122, but not substantially absorbed by insulator 160. As a result, the laser reaches layer 122 by passing through insulator 160.

In some embodiments, an electrically conductive layer can be irradiated with a laser from the side of the substrate that is opposite to the side on which a multilayer device is disposed. For example, electrically conductive layer 122 shown in FIG. 3(a) can be irradiated with a laser from the bottom of substrate 110. In such embodiments, the laser can have a wavelength such that it is primarily absorbed by layer 122, but not substantially absorbed by substrate 110. As a result, the laser reaches layer 122 by passing through substrate 110.

In some embodiments, a photovoltaic cell in module 100 can include a cathode as a bottom electrode and an anode as a top electrode. In some embodiments, a photovoltaic cell in module 100 can include an anode as a bottom electrode and a cathode as a top electrode.

In some embodiments, a photovoltaic cell in module 100 can further include a hole blocking layer (not shown in FIGS. 1-7). Typically, the hole blocking layer is disposed between a photoactive layer and an electrode at a side opposite to the hole carrier layer. For example, the hole carrier layer can be disposed between photoactive layer 130 and bottom electrode 120. In certain embodiments, some photovoltaic cells in module 100 include a hole blocking layer, while some photovoltaic cells do not include such a layer.

The hole blocking layer can generally be formed of a material that, at the thickness used in a photovoltaic cell, transports electrons to an electrode and substantially blocks the transport of holes to the electrode. Examples of materials from which the hole blocking layer can be formed include LiF, metal oxides (e.g., zinc oxide, titanium oxide), and amines (e.g., primary, secondary, or tertiary amines). Examples of amines suitable for use in a hole blocking layer have been described, for example, in commonly-owned co-pending U.S. Application Publication No. 2008-0264488, the entire contents of which are hereby incorporated by reference.

Without wishing to be bound by theory, it is believed that when a photovoltaic cell includes a hole blocking layer made of amines, the hole blocking layer can facilitate the formation of ohmic contact between a photoactive layer and an electrode, thereby reducing damage to the photovoltaic cell resulted from UV exposure.

Typically, a hole blocking layer can be at least 0.02 micron (e.g., at least about 0.03 micron, at least about 0.04 micron, at least about 0.05 micron) thick and/or at most about 0.5 micron (e.g., at most about 0.4 micron, at most about 0.3 micron, at most about 0.2 micron, at most about 0.1 micron) thick.

In some embodiments, a photovoltaic cell in module 100 can include certain layers shown in FIG. 1 in a reverse order.

In other words, a photovoltaic cell can include these layers from the bottom to the top in the following sequence: a substrate, a bottom electrode, a hole carrier layer, a photoactive layer, an optional hole blocking layer and a top electrode.

While photovoltaic cells have been described above, in some embodiments, the methods described herein can also be used in manufacturing tandem photovoltaic cells. Examples of tandem photovoltaic cells have been described in, for example, commonly owned co-pending U.S. Application Publication Nos. 2007-0181179 and 2007-0246094, the entire contents of which are hereby incorporated by reference.

While photovoltaic cells electrically connected in series have been described, in some embodiments, module 100 can also include photovoltaic cells electrically connected in parallel. For example, in a module having two photovoltaic cells electrically connected in parallel, the first photovoltaic cell can include the layers in the order shown in FIG. 1, the second photovoltaic cell can include the hole carrier layer between the bottom electrode and the photoactive layer, and the top electrode of the first photovoltaic cell can be electrically connected to the bottom electrode of the second photovoltaic cell. In certain embodiments, some photovoltaic cells in module 100 can be electrically connected in series, and some of the photovoltaic cells in module 100 can be electrically connected in parallel.

In some embodiments, the methods of preparing each layer (e.g., first electrically conductive layer 122, photoactive layer 130, hole carrier layer 140, top electrode 150, insulator 160, and the interconnecting electrically conductive material 170) in the photovoltaic cells described in FIGS. 1-7 can be readily incorporated in a continuous manufacturing process, such as a roll-to-roll process, thereby significantly reducing the time and cost of preparing a photovoltaic cell. Examples of roll-to-roll processes have been described in, for example, commonly-owned U.S. Pat. No. 7,022,910 and commonly-owned co-pending U.S. Application Publication Nos. 2005-0263179 and 2005-0272263, the contents of which are hereby incorporated by reference.

While organic photovoltaic cells have been described above, other types of photovoltaic cells can also be prepared by the methods described herein. Examples of such photovoltaic cells include dye sensitized photovoltaic cells and inorganic photoactive cells with an photoactive material formed of amorphous silicon, cadmium selenide, cadmium telluride, copper indium selenide, and copper indium gallium selenide. In some embodiments, a hybrid photovoltaic cell can also be prepared by the methods described herein.

While photovoltaic cells have been described above, in some embodiments, the compositions and methods described herein can be used to prepare a photoactive layer in other electronic devices and systems. For example, they can be used prepare a photoactive layer in suitable organic semiconductive devices, such as field effect transistors, photodetectors (e.g., IR detectors), photovoltaic detectors, imaging devices (e.g., RGB imaging devices for cameras or medical imaging systems), light emitting diodes (LEDs) (e.g., organic LEDs or IR or near IR LEDs), lasing devices, conversion layers (e.g., layers that convert visible emission into IR emission), amplifiers and emitters for telecommunication (e.g., dopants for fibers), storage elements (e.g., holographic storage elements), and electrochromic devices (e.g., electrochromic displays).

The following example is illustrative and not intended to be limiting.

EXAMPLE

Fabrication of Photovoltaic Modules

A mechanically-scored 5-lane photovoltaic module (i.e., containing 5 photovoltaic cells) and a laser-scored 5-lane photovoltaic module were fabricated as follows: An ITO coated PET substrate was first scored with by using laser ablation or mechanical scribing to form 5 lanes on the substrate. The scored substrate was cleaned by sonicating in isopropanol for 10 minutes. A 0.5% solution of cross-linkable organic material in butanol was blade coated onto the ITO at a speed of 5 mm/s at 80° C. to form an electron injection layer. A semiconductor blend of P3HT and PCBM in a mixture of tetralene and xylene was blade coated onto the electron injection layer at a speed of 40 mm/s at 65° C. and was dried to form a photoactive layer. Next, a polythiophene-based hole transport layer was blade coated onto the photoactive layer at a speed of 7.5 mm/s at 65° C. The whole stack was then annealed in a glove box at 140° C. for 5 minutes. A 5-lane photovoltaic module was then formed by thermally evaporated a layer of 300-nm silver thin film under a vacuum of $10^{-6}$ torr.

The performance of the mechanically-scored and laser-scored photovoltaic modules prepared above was measured and summarized in Table 1 below.

TABLE 1

| PV Parameters<br>Units | Eff<br>% | Voc<br>V | Jsc<br>mA/cm$^2$ | Vmax<br>V | FF<br>N/A |
|---|---|---|---|---|---|
| Mechanically-Scored Modules | 2.59 | 0.538 | 8.74 | 0.4 | 0.55 |
| Laser-Scored Modules | 2.55 | 0.537 | 8.88 | 0.39 | 0.535 |

The results showed that the laser-scored photovoltaic module exhibited a performance similar to that of the mechanically-scored photovoltaic module.

Other embodiments are in the claims.

What is claimed is:

1. A method, comprising:
   forming a first multilayer device on a transparent substrate, the first multilayer device comprising a first electrically conductive layer and a photo active layer,
   the first electrically conductive layer being between the photo active layer and the substrate; and
   after forming the first multilayer device, treating the first electrically conductive layer to form a plurality of discrete electrodes by forming a plurality of cavities so that each discrete electrode is separated from another discrete electrode by a cavity, thereby converting the first multilayer device into a first photovoltaic cell.

2. The method of claim 1 wherein the substrate is electrically non-conductive.

3. The method of claim 1 wherein the substrate comprises a polymer.

4. The method of claim 1 wherein the substrate comprises a polymer selected from the group consisting of a polyethylene terephthalate, a polyimide, a polyethylene naphthalate, a polymeric hydrocarbon, a cellulosic polymer, a polycarbonate, a polyamide, a polyether, and a polyether ketone.

5. The method of claim 1 wherein the substrate comprises a fluorinated polymer.

* * * * *